United States Patent [19]

Shimoyoshi et al.

[11] Patent Number: 5,634,082
[45] Date of Patent: *May 27, 1997

[54] HIGH EFFICIENCY AUDIO CODING DEVICE AND METHOD THEREFORE

[75] Inventors: Osamu Shimoyoshi; Kyoya Tsutsui, both of Kanagawa, Japan

[73] Assignee: Sony Corporation, Tokyo, Japan

[*] Notice: The term of this patent shall not extend beyond the expiration date of Pat. No. 5,471,558.

[21] Appl. No.: 443,033

[22] Filed: May 17, 1995

Related U.S. Application Data

[63] Continuation of Ser. No. 48,279, Apr. 14, 1993, abandoned.

[30] Foreign Application Priority Data

Apr. 27, 1992 [JP] Japan ................................. 4-131458

[51] Int. Cl.⁶ ................................................. G10L 3/02
[52] U.S. Cl. ...................... 395/2.38; 395/2.1; 395/2.33; 395/2.35; 395/2.94
[58] Field of Search ........................ 395/2, 2.1, 2.14, 395/2.2, 2.35–2.39; 381/29–40, 46

[56] References Cited

U.S. PATENT DOCUMENTS

| | | | |
|---|---|---|---|
| 5,115,240 | 5/1992 | Fugiwara et al. | 341/51 |
| 5,197,087 | 3/1993 | Iwahashi et al. | 375/122 |
| 5,241,603 | 8/1993 | Akagiri et al. | 381/30 |
| 5,311,561 | 5/1994 | Akagiri | 395/2.38 |
| 5,388,209 | 2/1995 | Akagiri | 395/2.38 |
| 5,438,643 | 8/1995 | Akagiri et al. | 395/2.39 |
| 5,471,558 | 11/1995 | Tsutsui | 395/2.39 |
| 5,490,170 | 2/1996 | Akagiri et al. | 381/30 |

FOREIGN PATENT DOCUMENTS

| | | | |
|---|---|---|---|
| 0420745A2 | 4/1991 | European Pat. Off. | H04B 1/66 |
| 0458645A2 | 11/1991 | European Pat. Off. | H04B 1/66 |
| 0466190A2 | 1/1992 | European Pat. Off. | G11B 20/10 |
| 0473367A1 | 3/1992 | European Pat. Off. | H03M 7/30 |

*Primary Examiner*—Allen R. MacDonald
*Assistant Examiner*—Alphonso A. Collins
*Attorney, Agent, or Firm*—Limbach & Limbach L.L.P.

[57] ABSTRACT

A high efficiency encoding audio signals is disclosed. The system includes a signal energy calculating circuit for calculating allowable noise energies by utilizing characteristics of human acoustic sense and calculating allowable noise energies of a block under consideration by weighted addition of the allowable noise energies calculated for at least one past block with respect to the block under consideration, a first-order allowable noise energy calculating unit, a second-order allowable noise energy calculating unit, a calculating circuit for calculating characteristics of human acoustic sense, and a memory. Adaptive quantization is performed in the quantization circuit with the bit allocation number which is based on the calculated allowable noise energies. Signals undergoing large temporal fluctuations can be encoded efficiently, while aurally outstanding noise may be reduced to improve the sound quality by eliminating sound quality deterioration known as pre-echo.

22 Claims, 7 Drawing Sheets

HIGH EFFICIENCY AUDIO CODING DEVICE AND METHOD THEREFORE

This is a continuation of application Ser. No. 08/048,279 filed on Apr. 14, 1993, now abandoned.

BACKGROUND OF THE INVENTION

1. Field of the Invention

This invention relates to a high efficiency encoding method and device for audio signals by subdividing digital audio signals into blocks and quantizing the signals from block to block by adaptive bit allocation.

2. Description of the Related Art

As a technique for high efficiency encoding of compressing and encoding audio signals, there is known a method of dividing digital audio signals into blocks at an interval of a predetermined number of samples or at an interval of a predetermined time frame, processing digital data with block floating techniques from block to block, quantizing the digital data in each block by adaptive bit allocation and transmitting the quantized digital data.

There is also known a method of transmitting parameters relevant to the block floating simultaneously with quantized and high efficiency encoded audio data.

The term block floating means the processing of multiplying each word of plural digital data in each block by a common word to give larger values for improving quantization accuracy.

Specifically, a maximum one of the absolute values of each word is found for the plural digital data in each block and all words in each block are processed by floating using a common floating coefficient by which the maximum absolute value is not saturated.

A block floating by 6 dB by bit shifting is one of the simpler examples of block floating.

Such block floating is performed on spectral signals produced by transforming time-domain audio signals of each time frame into frequency-domain signals by discrete transform.

Figure 8:
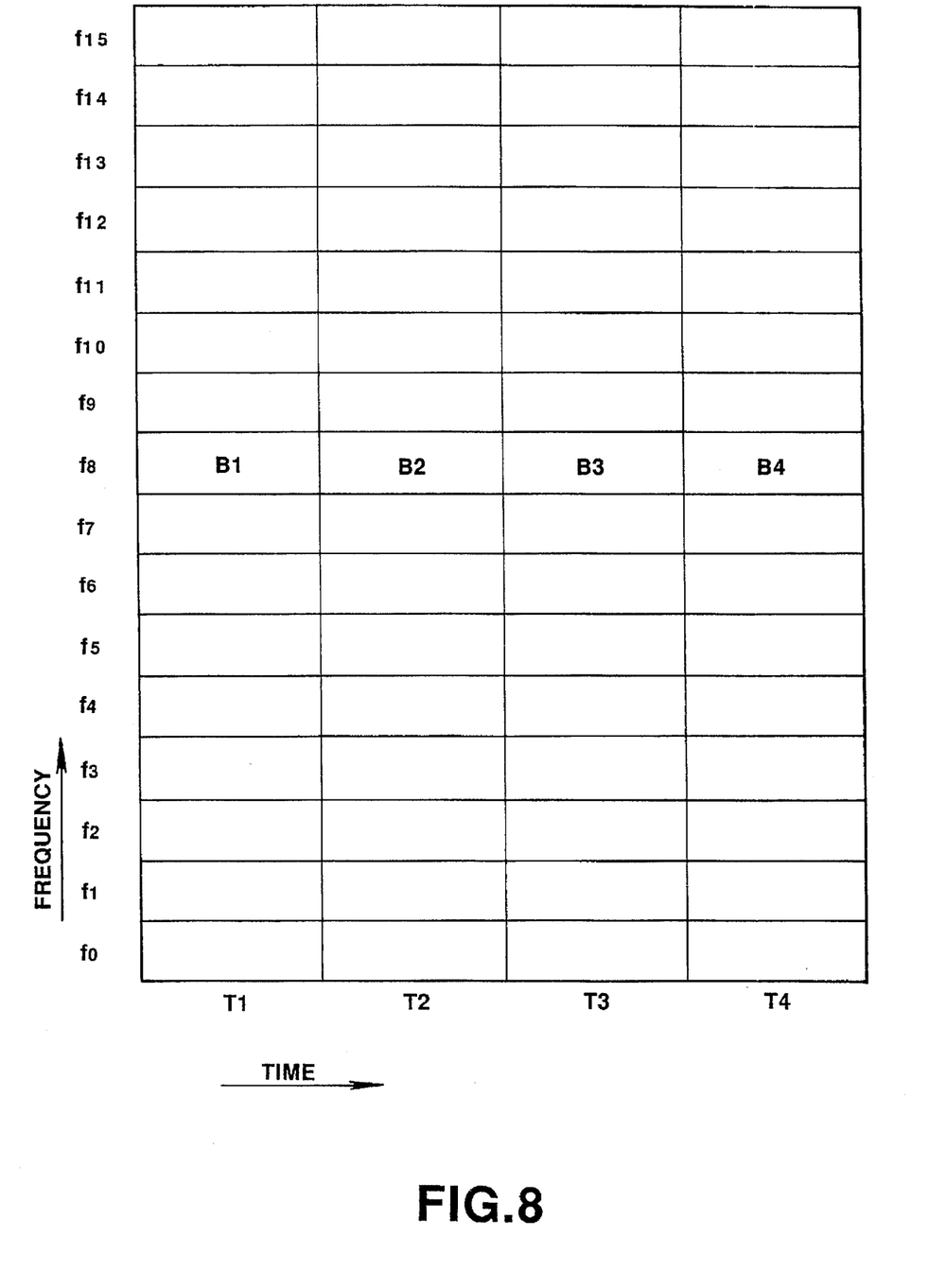
FIG. 8 is a diagrammatic view for illustrating a constitution of a frequency domain (block).

For illustrating the above-mentioned block floating, FIG. 8 diagrammatically shows how audio signals are subdivided into blocks.

The audio signals may be represented two-dimensionally as shown in FIG. 8 in which the abscissa and the ordinate indicate the time and the frequency, respectively.

The line segment indicating the time axis is divided into units each of a predetermined time length. These units are termed time frames T1 to T4. The time length of each time frame is preferably set to 11.6 msec. The line segment indicating the frequency axis is divided into 16 frequency domains. For convenience in explanation, the respective frequency domains are represented by their respective center frequencies f0 to f15.

The manner in which the four blocks T1 to T4 for the frequency domain f8, that is, four blocks B1 to B4, are processed with block floating, is hereinafter explained.

Meanwhile, in a system in which input audio signals are compressed by the above-mentioned block floating, a phenomenon known as pre-echo tends to be produced.

The present Assignee has already proposed means for remedying the pre-echo in our co-pending U.S. patent applications Ser. No. 07/553,608 filed on Jul. 18, 1990 and Ser. No. 07/664,300 filed on Mar. 4, 1991 and U.S. Pat. No. 5,115,240. Reference to the pre-echo has also been made in Edler, "Coding of Audio Signals with Overlapping Block Transform and Adaptive Window Functions", Frequent, Vol. 43, No. 9, 1989, pages 252 to 256.

This pre-echo, which presents serious problems when decoding and on the sound quality of the reproduced sound, is briefly explained.

For example, if impulse signals, that is signals undergoing acute rise in signal level, are present in a time frame for which block floating is performed, the quantization noise is produced substantially uniformly within the time frame. The result is that the quantization noise present in the low signal level portions is heard in the absence of the masking effect as later explained. This phenomenon is the above-mentioned pre-echo. Occasionally, the pre-echo means the quantization noise produced in the low signal level portions.

Figure 9:
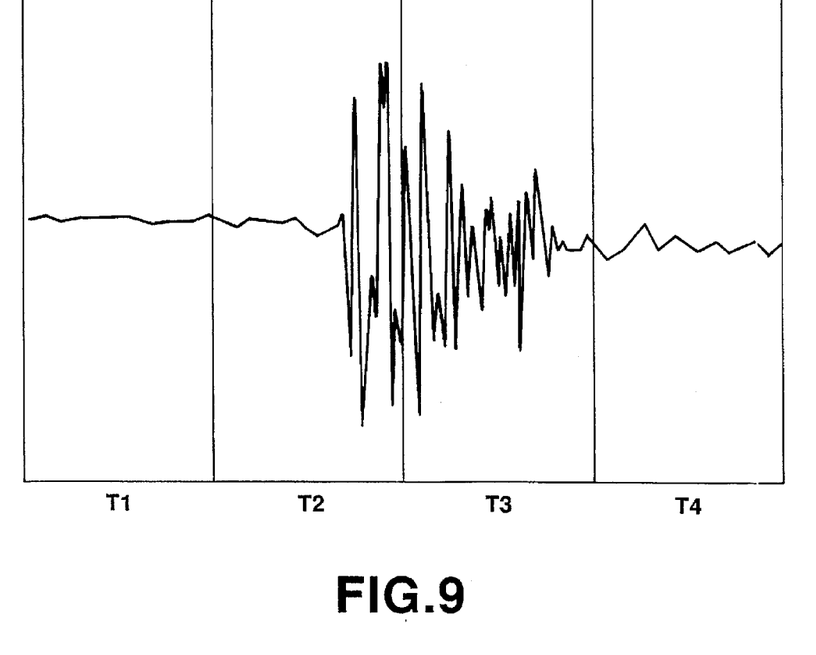
FIG. 9 is a waveform diagram for illustrating an example of transient signals.
Figure 10:
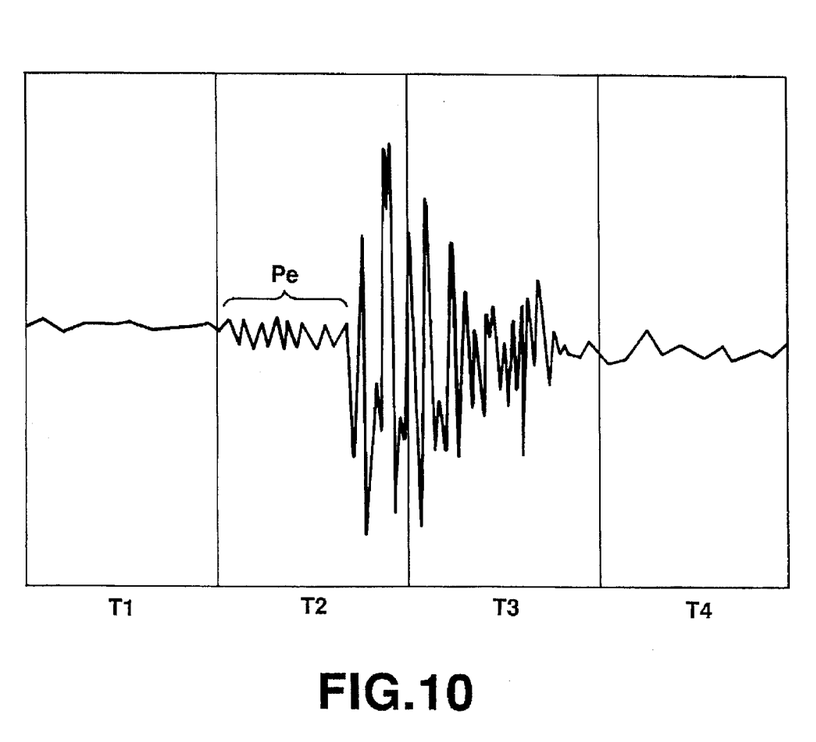
FIG. 10 is a waveform diagram for illustrating pre-echo.

The case will now be explained where audio signals waving an acutely rising signal level are processed with block floating for a predetermined time frame, herein each of time frames T1 to T4, as a unit, and subsequently decoded, that is, compressed audio signals are compressed and subsequently expanded, as shown in FIG. 9.

In such a case, the quantization noise present in the low signal level portion within a time frame T2 in which there are signals having an acutely rising signal level, that is the quantization noises present in the early half of the time frame T2, are perceived as pre-echo (pe).

The following is thought to account for the occurrence of such pre-echo.

Pre-echo is a phenomenon occurring in high efficiency encoding in which input audio signals are subdivided into blocks and processed, with block floating, from bloc to block and data in each block is quantized in accordance with adaptive bit allocation.

Figure 11:
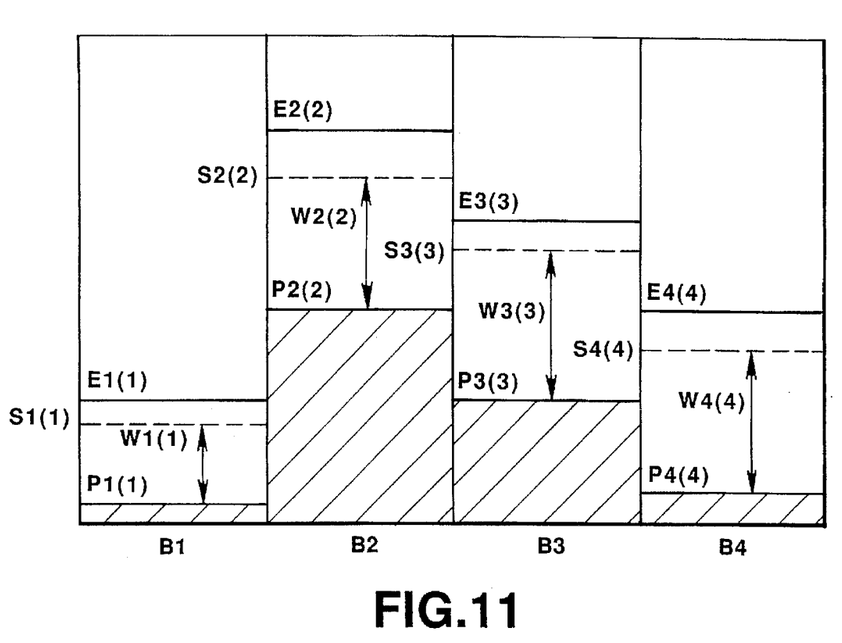
FIG. 11 is a diagrammatic view for illustrating how the number of allocated bits is determined in the conventional practice.

That is, for each of the blocks B1 to B4, input signal energies E, specifically, signal energies E1(1) to E4(4) for the blocks B1 to B4, are found, as shown for example in FIG. 11. The allowable noise energies P, specifically the allowable noise energies P1(1) to P4(4) which take into account the masking effect from block to block, are found based on these energies P1(1) to P4(4).

The word lengths corresponding to the numbers of allocated bits, that is word lengths W1(1) to W4(4), are then found from the allowable noise energies P1(1) to P4(4) and floating coefficients (scaling factors S1(1) to S4(4)) for the blocks B1 to B4.

It is noted that the floating coefficients or scaling factors S are found by multiplying a peak value or an average value of the block-by-block spectrum signal with a predetermined coefficient.

On the other hand, the word length W corresponding to the numbers of allocated bits is found on the basis of the allowable noise energies P associated with the energies E of the block-by-block spectral signals.

Referring to FIG. 11, since the signal energies in the latter half of the block B2 within time frame T2 are increased, as shown in FIG. 9, the signal energies E2(2) within the block B2 and the allowable noise energies P2(2) associated with the signal energies E2(2) are increased. So the noise level masked depending on the signal energies E2(2), are also increased. Consequently, the number of bits allocated to the block B2 for quantization of the spectral signals for block B2 corresponds to the word length W2(2). Therefore, only the number of bits sufficient to lower the quantization noise so as to be lower than the allowable noise energies P2(2) is allocated to the block B2.

However, the signal level is low for the first half of the time frame T2 for the block B2, as shown in FIG. 9. Therefore, in effect, the allowable noise energies for the first half of block B2 shown as sub-block a block B21 resulting from division of the block B2 into two equal parts or sub-blocks B21 and B22, should be of a low value, as shown in FIG. 12.

On the other hand, since the signal level of the latter half of the time frame T2 is increased acutely, that is the signal produced in the latter half of the time frame T2 is a transient signal, as shown in FIG. 9, the allowable noise energies P2(2)2 of the latter half sub-block B22 should be of a higher value.

Meanwhile, for assisting in understanding, signal energies E2(2)1, E2(2)2 for sub-blocks B21, B22 for the time frame T2 are also shown in association with the signals shown in FIG. 9.

Figure 12:
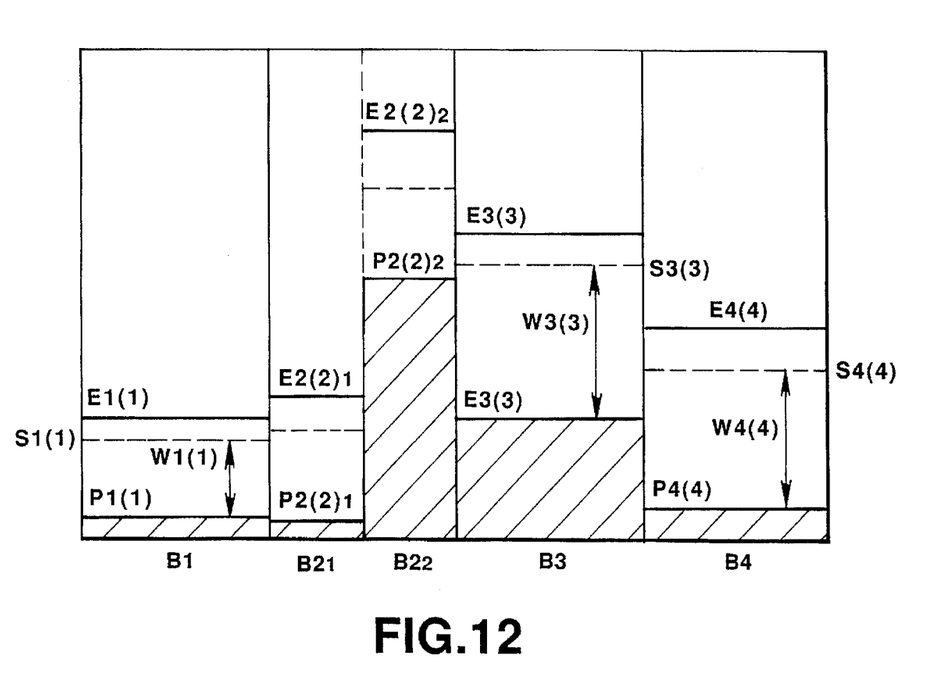
FIG. 12 is a diagrammatic view for illustrating the mechanism of occurrence of the pre-echo in the conventional practice od decision of the bit number allocation.

In light of the above, if the number of bit allocation is determined as shown in FIG. 11, the quantization noise in excess of the allowable noise energies P2(2)2 is present in the first half of the time frame T2 in FIG. 12, that is the sub-block B21, and it is perceived as pre-echo.

Meanwhile, for preventing the occurrence of the pre-echo, it is effective to diminish the time frame to as small a size as possible by a method consisting in diminishing the pre-echo time to the least value possible for rendering the pre-echo to be imperceptible by taking advantage of a so-called backward masking in which a temporary preceding sound is masked by a temporally succeeding impulse sound.

However, there is a certain limit to the reduction of the time frame length because too short a length of the time frame leads to worsened coding efficiency.

There is also known a method in which a time frame in which a signal having an acutely rising signal level is detected and an excess number of bits is allocated to the time frame to reduce the quantization noise.

However, it is difficult with this method to determine accurately what is the number of bit allocation sufficient to lower the pro-echo to a practically imperceptible level.

The present Assignee has proposed in U.S. patent application Ser. No. 07/553,608, which was already issued, a method for rendering the time length of the time frame variable and reducing the length of the time frame in which the signal level is increased acutely.

However, since block floating is carried out on spectral signals obtained by transform processing of the time domain audio signals of the time frame into signals on the frequency axis, it is difficult for too short three frames to co-exist in view of the window shape used to find the spectrum from the time domain signals. Consequently, it is rather difficult to prevent the pre-echo solely by the method of reducing the time frame.

SUMMARY OF THE INVENTION

In view of the above-depicted status of the art, it is an object of the present invention to provide a method for high efficiency encoding of audio signals whereby it becomes possible to prevent deterioration in the sound quality caused by pre-echo.

The high efficiency encoding system according to the present invention quantizes input audio signals by adaptive bit allocation at intervals of a predetermined unit. The system includes allowable noise energy calculating means 7 (FIG. 1) for calculating allowable noise energies, by utilizing characteristics of human acoustic sense, for each of the units, and calculating allowable noise energies for a unit under consideration by weighted addition of the allowable noise energies for at least one past block with respect to the unit under consideration. Quantization of the input audio signals is by the bit allocation number which is based on the allowable noise energies as found at the allowable noise energy calculating means.

Figure 1:
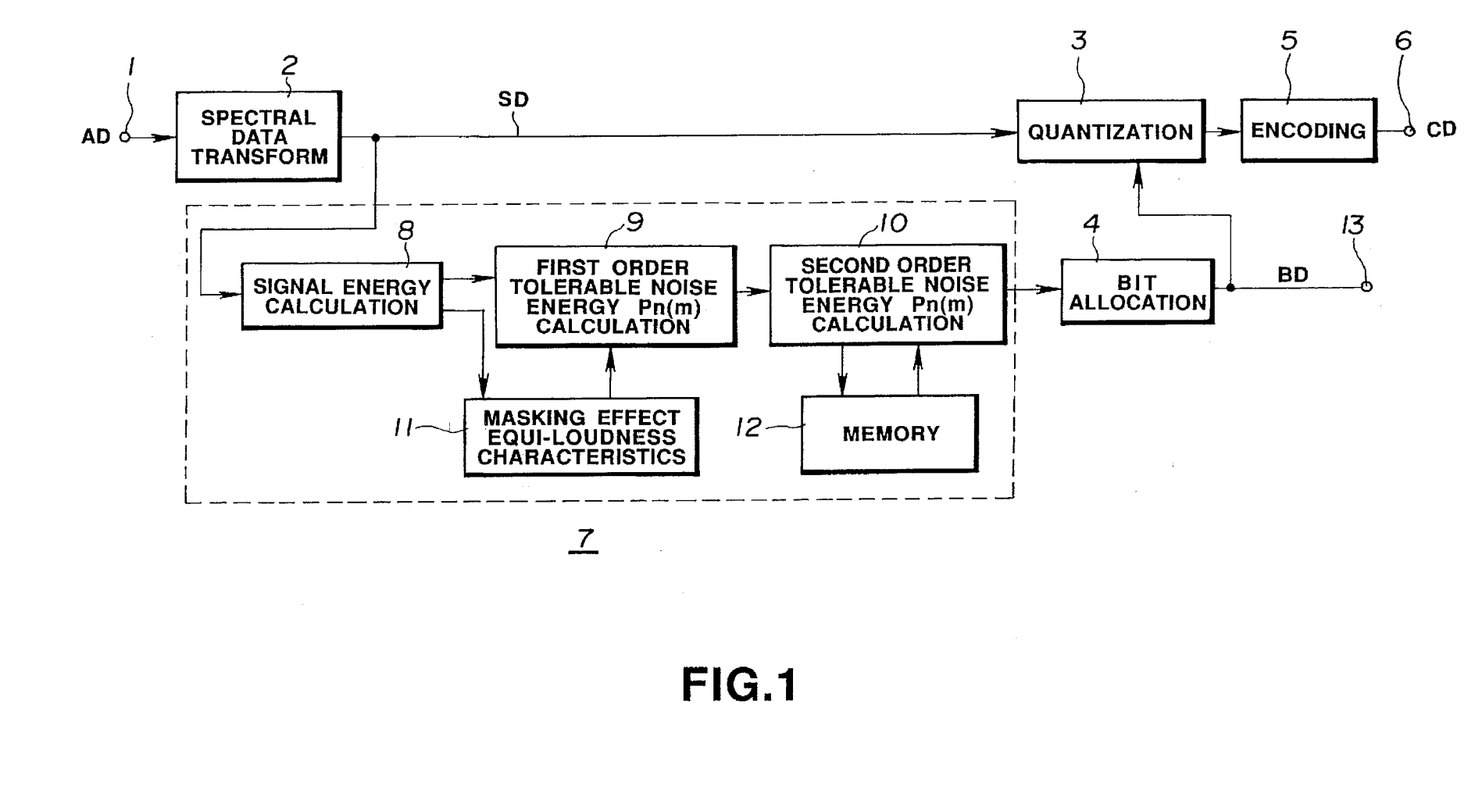
FIG. 1 is a schematic block diagram showing an arrangement of a high efficiency encoding system for audio signals according to the present invention.

The above-mentioned predetermined unit is a unit block for which block floating is performed. This unit block may each be made up of plural sub-blocks of the frequency-domain spectral data obtained by orthogonal transform of time-domain input audio signals at an interval of a predetermined number of samples. The allowable noise energy calculating means 7 calculates the allowable noise energies for each of these sub-bands or blocks by utilizing the above-mentioned characteristics of auditory sense.

Among the characteristics of the auditory sense, there are masking effects and equal-loudness characteristics.

The masking effects mean a phenomenon in which a tone is masked by another tone and becomes inaudible by certain characteristics of the auditory sense. In other words, masking means a phenomenon in which a signal is masked by another signal and becomes inaudible. These masking effects may be classified into time-axis masking by time-domain audio signals and concurrent masking by frequency-domain signals. By these masking effects, any noise present in masked portions becomes inaudible. For this reason, in actual audio signals, any noise within the masking range is an allowable noise.

The masking effects are classified into forward masking effects in which a temporally succeeding tone is masked by a temporally preceding tone, and a backward masking in which a temporally preceding tone is masked by a temporally succeeding tone, providing that such masking effects last for an extremely short period of time.

The equal-loudness characteristics or equal-loudness curves are among characteristic curves concerning the human auditory sense. The equal-loudness curve is found by connecting the values of sound pressure of the sounds at different frequencies, which are heard with the same loudness as a pure tone at 1 kHz, to form a curve. This curve is also termed an equal-loudness sensation curve.

Additionally, equal-loudness curves are of substantially the same contour as the minimum audibility threshold curve. It is thus seen from the equal-loudness curves that a tone in the vicinity of 4 kHz is heard with the same loudness as a tone at 1 kHz even though the sound pressure is decreased by 8 to 10 dB from that at 1 kHz. Conversely, a tone in the vicinity of 50 kHz can not be heard with the same loudness as that of a tone at 1 kHz unless the sound pressure is higher by about 15 dB than that at 1 kHz.

It is thus seen that the above-mentioned allowable noise level may be calculated taking the masking effects and equal-loudness characteristics into account for better adaptation to human auditory sense.

Thus the present invention includes determining the allowable noise energies by utilizing the masking effects and the equal-loudness characteristics, in presupposing correlation between temporally consecutive blocks and recalculating the allowable noise energies for preventing occurrence of the deterioration in the sound quality known as pre-echo.

Specifically, the present invention provides a high efficiency encoding system for audio signals comprising spectral data transforming means for transforming input audio signals, from one predetermined time frame to another, into spectral data, that is for transforming the input audio signals into frequency-domain components by discrete transform, such as FFT or DCT. Signal energy calculating means are provided for subdividing time frame based spectral data into blocks each of a predetermined frequency band and calculating signal energies from one block to another, first-order allowable noise energy calculating means for calculating, from signal energies as calculated by the signal energy calculating means, allowable noise energies allowable from one block to another, that is first-order allowable noise energies, by utilizing aural masking characteristics and equal-loudness characteristics. Second-order allowable noise energy calculating means are provided for calculation, when finding allowable noise energies for one of the blocks under consideration, the second-order allowable noise energies of said block under consideration, that is the ultimate allowable noise energies for the block under consideration, by employing second-order allowable noise energies previously found for one or more past blocks with respect of the block under consideration, in other words, for calculating the second-order allowable noise energies of the block under consideration by weighted addition of the second-order allowable noise energies as found for the past blocks. Memory means are provided for storing the second-order allowable noise energies for the past blocks, designed to be used in the second-order allowable noise energy calculating means. Also provided are bits allocation number decision means for deciding an optimum bit allocation number from block to bock based on the second-order allowable noise energies as found by the second-order noise energy calculating means, quantization means for quantizing the spectral data by adaptive bit allocation for each of the blocks based on the number of bits allocated by the bit allocation number decision means, and an encoding means for encoding the spectral data quantized by the quantization means with a predetermined number of bits.

With the high efficiency encoding system of the present invention, the number of bits allocated for quantization depends on the allowable noise energies conforming to signal energies. Consequently, for larger allowable noise energies, the number of allocated bits may safely be reduced because quantization distortion is less perceptible, whereas, for lesser allowable noise energies, quantization distortion becomes outstanding unless the number of allocated bit is increased.

If transient signals are present in the block under consideration, pre-echo is produced in a rising portion of the transient signals.

However, by weighted addition of the allowable noise energies previously calculated for the past steady-state blocks in calculating the allowable noise energies for the block under consideration, the allowable noise energies calculated for the block under consideration may be diminished to render it possible to increase the number of allocated bits based on the allowable noise energies.

In this manner, the pre-echo otherwise produced at the rising portions of the transient signals in the block under consideration may be prevented from occurring.

DESCRIPTION OF THE PREFERRED EMBODIMENTS

By referring to the drawings, preferred embodiments of the present invention will be explained in detail.

Reference is first made to FIG. 1. In the present high efficiency encoding apparatus for audio signals, digital audio PCM signals AD are supplied via an input terminal 1 to a spectral data transform circuit 2 where the time domain audio PCM signals AD are converted into frequency domain spectral data SD by frequency analyses by orthogonal transform at intervals of an N number of samples.

The spectral data SD from the spectral data transform circuit 2 is transmitted to a quantization circuit 3. The quantization circuit normalizes the spectral data SD by block floating in a manner not shown and subsequently quantizes the normalized data based on bit allocation number data BD from a bit allocation circuit 4. The quantized output of the quantization circuit 3 is encoded by an encoding circuit 5 with a predetermined number of bits. It is this encoded output CD that is supplied at an output terminal 6 to downstream circuitry, not shown.

The present invention is characterized by allowable noise calculating means 7 as a reference for bit allocation.

The allowable noise energy calculating means 7 is made up of a signal energy calculating circuit 8, a first order allowable noise energy calculating circuit 9, a second order allowable noise energy calculating circuit 10, an acoustic characteristics calculating circuit 11 and a memory for secondary noise energies 12, as later explained. Bit allocation is performed on the basis of data produced by the allowable noise energy calculating means 7.

The allowable noise energy calculating means 7 calculates the allowable noise energy depending on characteristics of human acoustic sense for each of the above-mentioned predetermined units and adds previously calculated weighting values for predetermined past units related to the predetermined unit under consideration to the allowable noise energy to give the allowable noise energy for the predetermined unit under consideration.

The above-mentioned quantization is performed using the allocated bit number as determined based on the allowable noise energy calculated by the allowable noise energy calculating means 7.

In the present embodiment, the above-mentioned predetermined unit is the block unit employed for block floating. The block employed for the block floating is a sub-block sub-divided from a block by which spectral data on the frequency axis are produced by orthogonal transform of input audio signal on the time axis from sample to sample.

In the present embodiment, so-called masking characteristics and equal-loudness characteristics are used as characteristics of the human auditory sense.

However, at least one of the masking characteristics may also be employed for simplicity.

Figure 2:
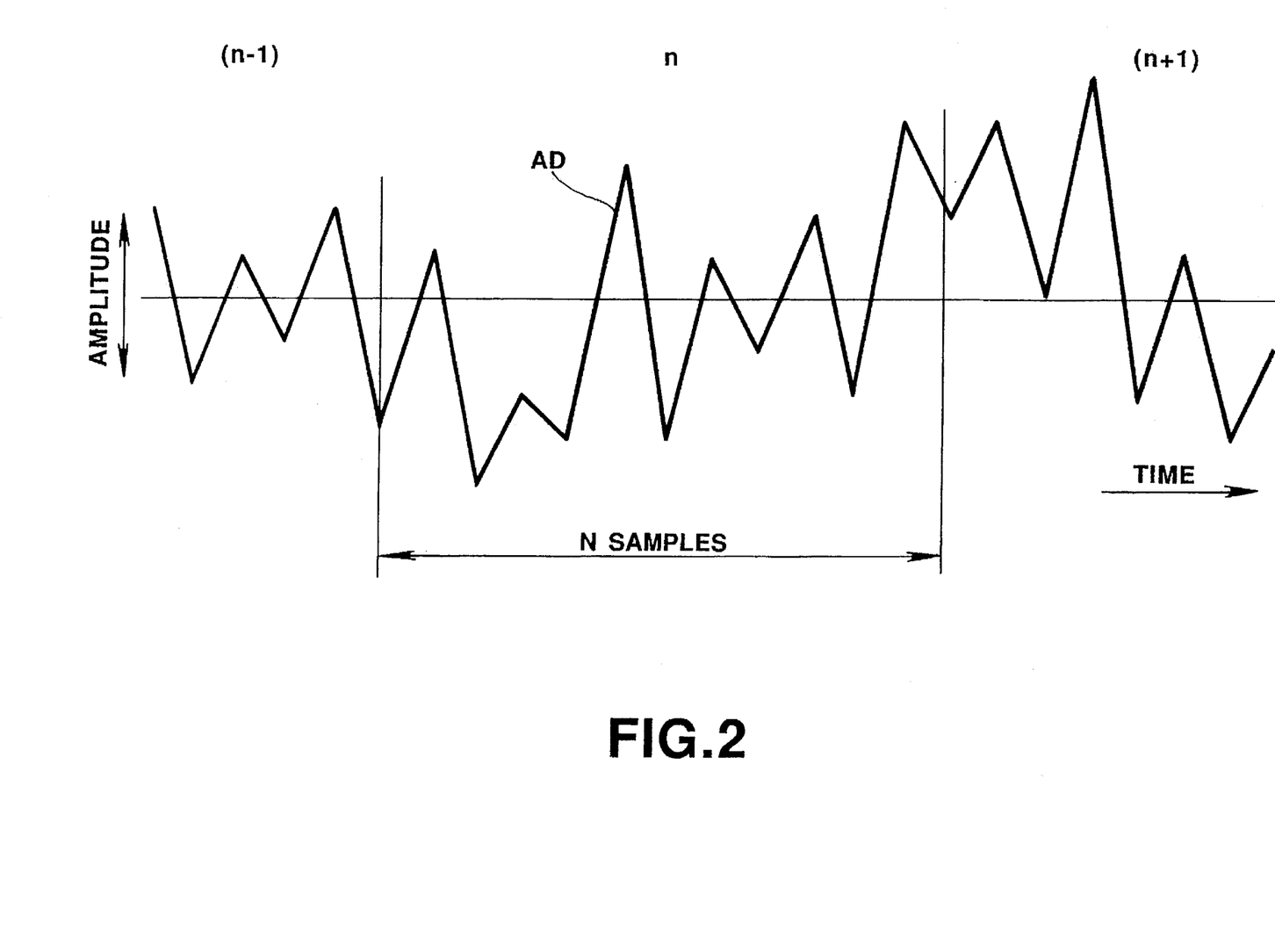
FIG. 2 is a diagrammatic view showing input audio signals and units employed for frequency analyses.

That is, in the high efficiency encoding apparatus for audio signals, shown in FIG. 1, the digital audio PCM signals AD as shown for example in FIG. 2 are supplied to an input terminal 1.

Figure 3:
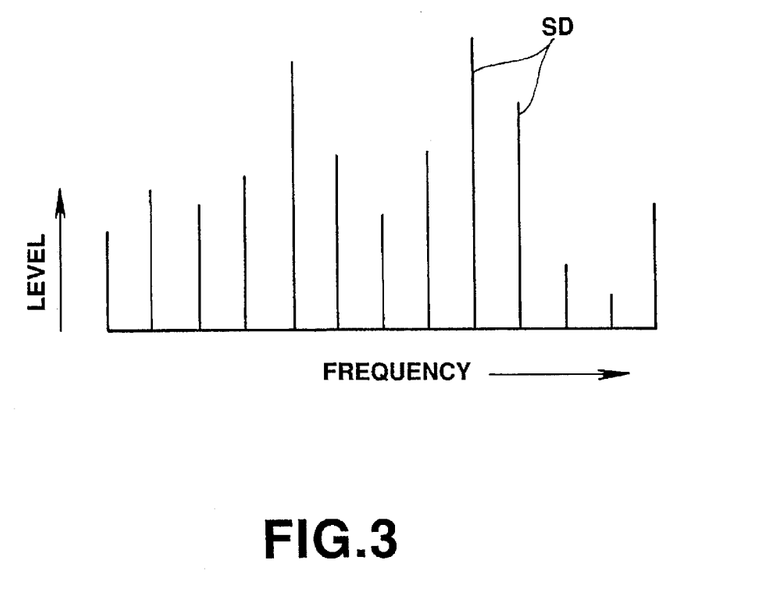
FIG. 3 is a graph showing spectral data obtained by frequency analyses.

These audio PCM signals AD are supplied to the spectral data transform circuit 2 in which the time domain audio PCM signals AD are frequency-analyzed at intervals of an N number of samples by orthogonal transform for producing frequency domain spectral data SD as shown in FIG. 3.

In addition to orthogonal transform, discrete cosine transform (DCT) or fast Fourier transform may be employed.

Modified discrete cosine transform (MDCT) may also be employed.

In the present embodiment, the above-mentioned analysis by orthogonal transform is performed with the N number of time-domain samples as a unit which is termed a frame. In FIG. 2, each frame is designated by numbers . . . , n−1, n, n+1, . . . .

The spectral data from spectral data transform circuit 2 is transmitted to quantization circuit 3. The quantization circuit normalizes the spectral data SD by block floating in a manner as explained earlier and subsequently quantizes the normalized data based on the allocation bit number data BD from the bit allocation circuit. The floating coefficient, that is the scaling factor, for block floating, may be found by multiplying the peak value or the mean value of the spectral data SD by a predetermined coefficient.

The quantized output of the quantization circuit 3 is encoded with a predetermined number of bits from the encoding circuit 5. The encoded output CD is transmitted via output terminal 6 to downstream circuitry, not shown.

With the present high efficiency encoding device, the adaptive bit allocation number data BD, employed for block-by-block quantization in the quantization circuit 3, is found in the following manner.

For finding the allocation bit number for adaptive quantization, the spectral data SD from the spectral data transform circuit 2 is also supplied to a signal energy calculating circuit 8.

Figure 4:
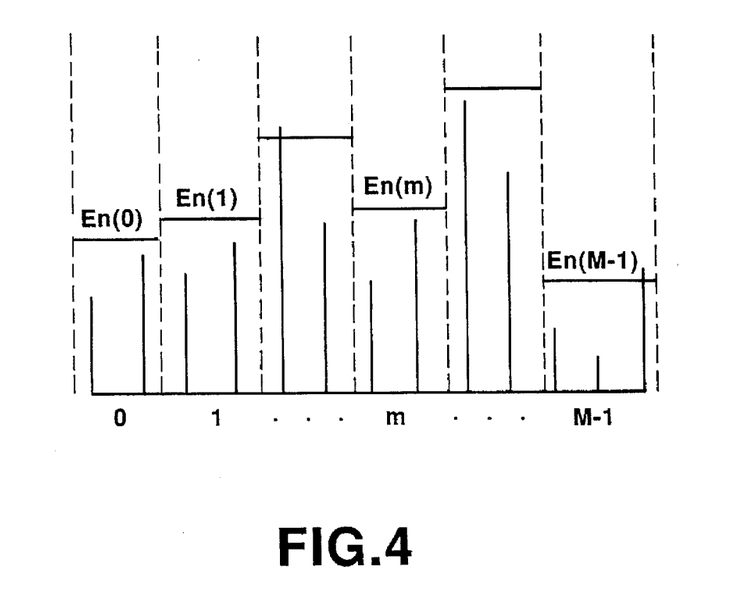
FIG. 4 is a graph for illustrating signal energies for each frequency domain (block).

In the signal energy calculating circuit 8, the spectral data SD produced as shown in FIG. 3 is divided into an M number of bands or blocks of from 0 to (M−1), for each of which the signal energies $En(m)$ are found.

Since the block floating is performed in the present embodiment as described above, the M number of bands or blocks in the signal energy calculating circuit 8 are employed as a unit of division in carrying out the block floating.

Meanwhile, $\underline{n}$ in the signal energy $En(m)$ indicates an n'th frame of the input PCM audio signal AD and m indicates the m'th block from the high frequency range or from the low frequency range within the n'th frame.

The signal energies $En(m)$, as found from block to block by the signal energy calculating circuit 8, are transmitted to the first order allowable noise energy calculating circuit 9.

The first order allowable noise energy calculating circuit 9 finds, from block to block, the allowable noise energies (first-order allowable noise energies) $pn(m)$, which may be allowed on the block-by-block basis, by taking advantage of the aural characteristics, such as masking effects or equal-loudness characteristics, from the supplied signal energies $En(m)$. The block herein means the block for block floating. Meanwhile, $\underline{n}$ in the first order allowable noise energies indicates the above-mentioned n'th frame, and m indicates the m'th block of the n'th frame.

The aural characteristics utilized in calculating the first order allowable noise energies $pn(m)$ by the first order allowable noise energy calculating circuit 9 are the above-mentioned masking effect and the equal-loudness characteristics as found by the aural characteristics calculating circuit 11 based on the signal energies as found by the signal energy calculating circuit 8.

The first order allowable noise energy $pn(m)$ of the m'th block of the n'th frames as found by the first order noise energy calculating circuit 9, is transmitted to the downstream side second order allowable noise energy calculating circuit 10.

In the second order allowable noise energy calculating circuit 10, the second order allowable noise energy $Pn(m)$ of a block under consideration, that is the m'th block of the n'th frame, is calculated by weighted addition of the allowable noise energies (second order allowable noise energies) previously calculated for past blocks with respect to the block under consideration, that is the m'th block of the n'th frame.

If the past three blocks with respect to the block under consideration, that is the m'th block of the n'th frame, are used, and the second order allowable noise energies $Pn(m)$ of the block under consideration are to be found, weighted addition of the second order allowable noise energies $Pn-3(m)$, $Pn-2(m)$ and $Pn-1(m)$ of the three past blocks to the first, order allowable noise energy $pn(m)$ of the block under consideration is performed in accordance with the following formula (1)

$$Pn(m)=\alpha(0) \cdot [Pn(m)] \; pn(m)+\alpha(1) \cdot Pn-1(m)+\alpha(2) \cdot Pn-2(m)+\alpha(3) \cdot Pn-3(m)$$

In the formula (1), $m \leq m \leq M-1$ and $Pn(m)$ is the second order allowable noise energy of the m'th floating block in the n'th frame.

$Pn-1(m)$ is the second order allowable noise energy for the m'th block of the (n−1)th frame, $Pn-2(m)$ is the second order allowable noise energy for the m'th block of the (n−2)th frame and $Pn-3(m)$ is the second order allowable noise energy for the m'th block of the (n−3)th frame.

$a(i)$ is a weighting function and $a(i)$ satisfies the conditions $\Sigma a(i)=1$ and $a(i)>a(i+1)$ $a(i)$ represents value such that $a(i)=\{0.7, 0.2, 0.05, 0.05\}$, where i represents 0, 1, 2, 3.

The above-mentioned second order allowable energy calculating circuit 10 performs the above calculation on a block-by-block basis.

The second order allowable noise energies of the respective past blocks, employed for the calculation in the above-mentioned second order allowable noise energy calculating circuit 10, are held in a memory 12 which is storage means for storing previously found second order allowable noise energies.

Meanwhile, the data stored in memory 12 may also be the above-mentioned three past data and data temporarily preceding the above-mentioned three past data.

Additionally, the second order allowable noise energies of the block under consideration may also be calculated based on the second order allowable noise energies of at least one past block, instead of three or more past blocks, as mentioned previously.

If, at the time of start of use of the present high efficiency encoding device, second order allowable noise energies of one or more past blocks are not present in memory 12, first order allowable noise energies may be employed in place of the second order allowable noise energies to prevent malfunction from occurring.

Alternatively, a preselected value may be employed in place of the second order allowable noise energies only during the start time.

Data of the second order allowable noise energies Pn(m) of the block under consideration, as found by the second order allowable noise energy calculating circuit 10, are supplied to the bit allocation circuit 4 as bit allocation number decision means.

The bit allocation circuit 4 calculates an optimum bit allocation number data BD for quantization of the spectral data SD of the m'th block of the n'th frame by the quantization circuit 3, based on the second order allowable noise energy Pn(m) of the m'th block of the n'th frame as found by the second-order allowable noise energy calculating circuit 10, and outputs, e.g., word length data corresponding to the allocation bit number.

The quantization circuit 3 performs adaptive quantization of the spectral data SD of the m'th block based on the bit allocation number BD of the m'th block (word length data) as found by the bit allocation circuit 4.

The bit allocation number data BD are supplied from the bit allocation circuit 4 to the downstream circuitry via terminal 13.

In the downstream side circuitry, not shown, the allocation bit number data BD from terminal 13 are mixed with an encoding output CD from terminal 11 as time-divisional data and suitable code data for error correction are appended to the time-divisional data.

The above-mentioned second order allowable noise energies Pn(m), as found by the above-mentioned second-order allowable noise energy calculating means, are now considered from the viewpoint of human aural sense.

FIGS. 5 to 7 show three types of input audio signals as crest values of the input audio PCM signals AD.

FIGS. 5, 6 and 7 illustrate input audio signals in which acutely rising energies are produced in the n'th frame, and steady-state input audio signals and input audio signals in which acutely decreased signal energies are produced in the n'th frame, respectively.

Figure 5A:
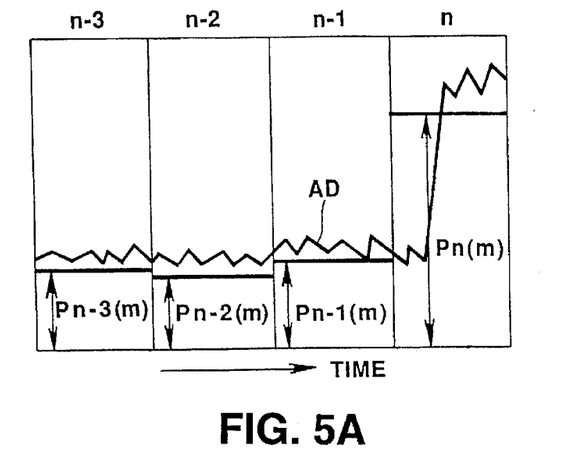
FIG. 5 is a diagrammatic view for illustrating a process for calculating second-order allowable noise energies of an m'th block when a signal with acutely increasing signal energies is entered as input audio signal to an n'th frame.
Figure 6A:
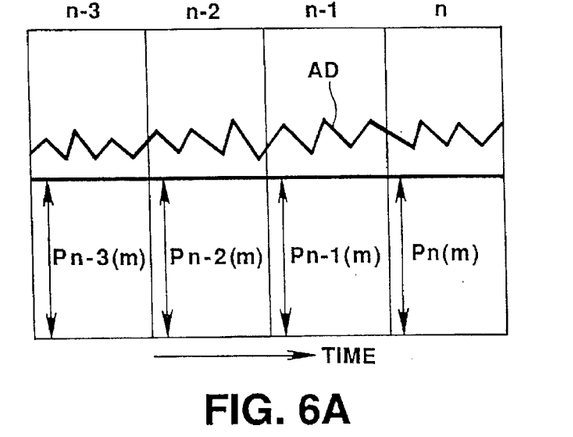
FIG. 6 is a diagrammatic view for illustrating a process for calculating second-order allowable noise energies of an m'th block when a completely steady-state signal is entered as an input audio signal.
Figure 7A:
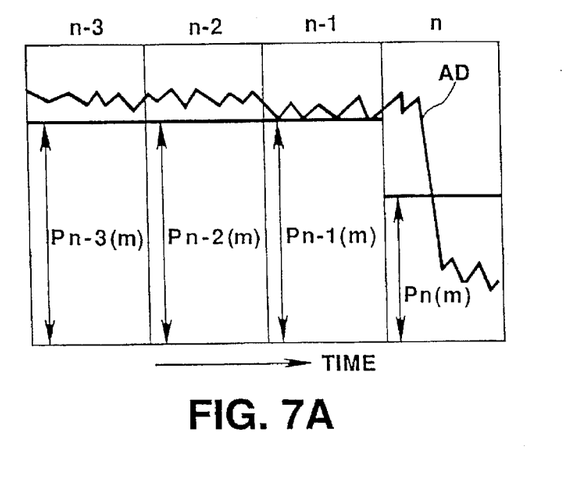
FIG. 7 is a diagrammatic view for illustrating a process for calculating second-order allowable noise energies of an m'th block when a signal with acutely decreasing signal energies is entered as input audio signal to an n'th frame.

In FIGS. 5a, 6a and 7a, second order allowable noise energies Pn–3(m), Pn–2(m), Pn–1(m) of the m'th blocks of the (n–3)th, (n–2)th and (n–1)th frames for the above-mentioned three types of the input signals AD, and the first order allowable noise energies pn(m) of the m'th block of the n'th frame, are indicated by thick solid lines, respectively.

Figure 5B:
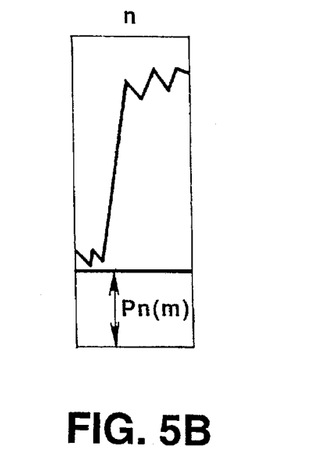
Figure 6B:
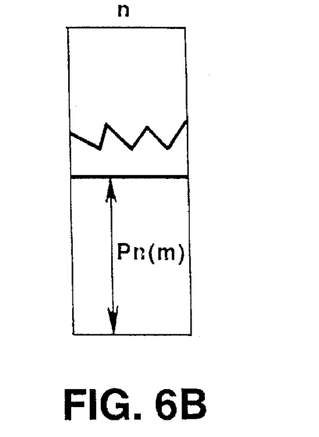
Figure 7B:
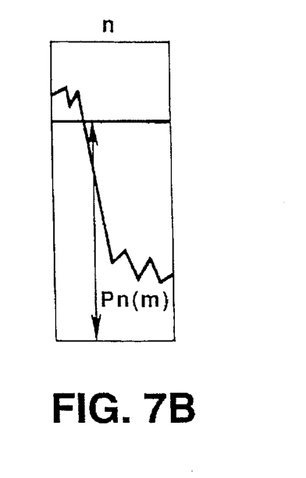

In FIGS. 5b, 6b and 7b, the second order allowable noise energies Pn(m) of the m'th block of the n'th frame, as found for the three types of the input audio signals, are indicated by thick solid lines, respectively.

With the high efficiency encoding device of the present embodiment, when signals acutely changed to high energy level signals are generated in the n'th frame, as shown at a in FIG. 5, and encoding is carried out with the allocated number of bits based on the calculated value of the first order allowable noise energies pn(m), unallowable or unmasked noise or pre-echo is produced at the leading end of the frame n. By performing weighted addition of previously calculated second order allowable noise energies Pn–i (m), where i=3, 2, 1, to the first order allowable noise energies pn(m) of the m'th block of the n'th frame, the second order allowable noise energies Pn(m) of the m'th block of the n'th frame are produced.

The second order allowable noise energies Pn(m) are smaller than the first order allowable noise energies pn(m) and hence operate to suppress the pre-echo to render it less perceptible.

If signals acutely changed to low energy level signals are generated in the n'th frame, as shown in FIG. 7, the previously calculated values of the second order allowable noise energies Pn–1(m) are weight-added to increase a calculated value of the second order allowable noise energy Pn(m) of the m'th block of the n'th block to a larger value, so that unallowable noise is produced within the n'th frame. However, the noise is not heard because of the masking effect on the time axis, for example, the above-mentioned forward masking effect.

If the input signals are fully steady-state signals, as shown in FIG. 6, the first order allowable noise energies pn(m) is equal to the value of the previously calculated past second order allowable noise energies Pn–1(m), so that the second order allowable noise energies of the m'th block of the n'th frame are not changed from the first order allowable noise energies pn(m) by the above-mentioned weighted addition, so that the effect by the recalculation of the allowable noise energies is nil.

With the above-described high efficiency encoding apparatus of the present embodiment, the allowable noise energies are calculated by taking advantage of the aural masking properties and equal-loudness characteristics from block to block, at the same time that weighted addition of the second order allowable noise energies Pn–1(m) calculated for past blocks with respect to the block under consideration is performed, and adaptive quantization is performed with the bit allocation number based on the second order allowable noise energies.

In this manner, efficient encoding may be achieved for signals which are acutely changed in signal level with lapse of time to reduce the aurally outstanding noise to improve the sound quality. That is, deterioration in sound quality known as pre-echo may be prevented from occurrence.

Specifically, the allowable noise energy calculating means 7 for calculating the second order allowable noise energies Pn(m) of the block under consideration is made up of a signal energy calculating circuit 8, a first order allowable noise energy calculating circuit 9, a second order allowable noise energy calculating circuit 10, an aural characteristics calculating circuit 11 and a memory 12. The spectral data is quantized by the quantization circuit 3 with the bit allocation number BD which is based on the allowable noise energy as found by the allowable noise energy calculating means 7.

The foregoing description has been made of an encoding system for encoding frequency-domain spectral data converted from the time-domain audio signals.

The present invention may also be applied to an encoding system in which time-domain signals are subdivided into sub-bands and data in each sub-band are encoded and processed with block floating.

It will be seen from above that the present invention provides a system for high efficiency encoding of audio signals in which there is provided allowable noise energy calculating means 7 for calculating the allowable noise energies from block to block by utilizing characteristics of the human auditory sense and calculating the allowable noise energies of a block under consideration by weighted addition of allowable noise energies for the past blocks temporally preceding the block under consideration, and in which block data are quantized on the basis of the allowable noise energies as found by the allowable noise energy calculating means 7.

Consequently, signals undergoing considerable temporal fluctuations may be efficiently encoded for reducing the noise which is more outstanding to human ears for improving the sound quality. That, is, deterioration in the sound quality known as pre-echo may be prevented from occurring.

What is claimed is:

1. A high efficiency encoding device for audio signals comprising:

spectral data transforming means for transforming audio signals into spectral data from one predetermined time frame to another;

quantization means for dividing said spectral data into plural blocks and quantizing said spectral data by adaptive bit allocation for each of said blocks, thereby generating quantized signals;

encoding means for encoding said quantized signals;

allowable noise energy calculating means for calculating a first order and a second order allowable noise energy for each of said blocks, said block for which the first and second order allowable noise energies is being calculated being designated a current block, wherein the allowable noise energy calculating means further comprises:

signal energy calculating means for calculating signal energies for each of said blocks;

means for calculating the first-order allowable noise energy for the current block from the signal energies by utilizing characteristics of human auditory sense; and means for calculating the second-order allowable noise energy for the current block by summing a weighted first-order allowable noise energy for the current block and a weighted second-order allowable noise energy for a previous block; and bit allocation means for finding the allocation bit number based on the allowable noise energies as found by said allowable noise energy calculating means, wherein said spectral data is quantized by said quantization means based on said bit allocation number.

2. The high efficiency encoding system for audio signals of claim 1, wherein said allowable noise energy calculating means further comprises:

memory means for storing said second-order allowable noise energy, wherein said means for calculating the second-order allowable noise energy weights said first-order allowable noise energy of each block in a predetermined manner by utilizing a second-order allowable noise energy of said past block stored in said memory means and supplies the calculated second-order allowable noise energy to said bit allocation means for determining an optimum bit allocation number for each of said blocks.

3. The high efficiency encoding system for audio signals of claim 2, wherein said memory means stores the second-order allowable noise energy of one past block.

4. The high efficiency encoding system for audio signals of claim 3, wherein said block is a block for block floating.

5. The high efficiency encoding system for audio signals of claim 4, wherein said characteristics of human auditory sense include aural masking characteristics.

6. The high efficiency encoding system for audio signals of claim 4, wherein said characteristics of human auditory sense include equal-loudness characteristics.

7. The high efficiency encoding system for audio signals of claim 4, wherein said characteristics of human auditory sense include aural masking and equal-loudness characteristics.

8. The high efficiency encoding device for audio signals of claim 1, wherein the means for calculating the second-order allowable noise energy for a current block further comprises:

means for summing a weighted second order allowable noise energy term for a plurality of previous blocks.

9. The high efficiency encoding device for audio signals of claim 8, wherein each of the plurality of second order allowable noise energy terms has an associated one of a plurality of weights and at least two of the weights have different values.

10. The high efficiency encoding device for audio signals of claim 9, wherein a weight of a second order noise energy for a block closer to the current block is larger than a weight of a second order allowable noise energy for a block further away from the current block.

11. The high efficiency encoding system for audio signals of claims 1, 2, 3, 4, 5, 6 or 7, wherein said spectral data transform means includes discrete transform means.

12. The high efficiency encoding system for audio signals of claims 1, 2, 3, 4, 5, 6 or 7, wherein said spectral data transform means include discrete Fourier transform means.

13. The high efficiency encoding system for audio signals of claim 1, wherein said spectral data transforming means is a discrete cosine transform (DCT).

14. The high efficiency encoding system for audio signals of claim 1, wherein said spectral data transforming means is a modified discrete cosine transform (MDCT).

15. A method for high efficiency encoding of audio signals, comprising:

transforming audio signals into spectral data from one predetermined time frame to another;

subdividing said spectral data into a plurality of blocks;

quantizing said spectral data by adaptive bit allocation for each of said blocks, thereby generating quantized signals;

encoding said quantized signals;

calculating a first-order allowable noise energy for each of said blocks by utilizing characteristics of human auditory sense, said block for which the first order allowable noise energy is calculated being designated a current block;

calculating a second-order allowable noise energy for each of said blocks by summing a weighted first-order allowable noise energy for the current block and a weighted second-order allowable noise energy for a previous block; and determining bit allocation numbers based on said second-order allowable noise energies, wherein said spectral data is quantized based on said allocation bit number.

16. The high efficiency encoding method of claim 15, further comprising the step of:

storing a second-order allowable noise energy data for a previous block, wherein the stored data is used to calculate a second-order allowable noise energy for a block later than that for which the data is stored.

17. The high efficiency encoding method of claim 15, wherein said step of calculating first-order allowable noise energies by utilizing characteristics of human auditory sense for each of said blocks includes utilizing aural masking characteristics.

18. The high efficiency encoding method of claim 15, wherein said step of calculating first-order allowable noise energies by utilizing characteristics of human auditory sense for each of said blocks includes utilizing equal-loudness characteristics.

19. The method for high efficiency encoding of audio signals of claim 15, wherein the step of calculating a second-order allowable noise energy for each of said blocks further comprises:

summing a weighted second order allowable noise energy term for a plurality of previous blocks.

20. The method for high efficiency encoding of audio signals of claim 19, wherein each of the plurality of second order allowable noise energy terms has an associated one of a plurality of weights and at least two of the weights have different values.

21. The method for high efficiency encoding of audio signals of claim 20, wherein a weight of a second order noise energy for a block closer to the current block is larger than a weight of a second order allowable noise energy for a block further away from the current block.

22. The high efficiency encoding method of claims 12, 13, 14 or 15, wherein the step of transforming audio signals into spectral data is performed by discrete transform.

* * * * *